United States Patent
Shin et al.

(10) Patent No.: US 7,598,783 B2
(45) Date of Patent: Oct. 6, 2009

(54) DLL CIRCUIT AND METHOD OF CONTROLLING THE SAME

(75) Inventors: Dong-Suk Shin, Gyeonggi-do (KR); Hyun-Woo Lee, Gyeonggi-do (KR); Won-Joo Yun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 170 days.

(21) Appl. No.: 11/826,401

(22) Filed: Jul. 16, 2007

(65) Prior Publication Data

US 2008/0174350 A1 Jul. 24, 2008

(30) Foreign Application Priority Data

Jan. 24, 2007 (KR) ................ 10-2007-0007371

(51) Int. Cl.
 *H03L 7/06* (2006.01)
(52) U.S. Cl. .............. 327/158; 327/156; 327/175
(58) Field of Classification Search ............ 327/156, 327/158
 See application file for complete search history.

(56) References Cited

U.S. PATENT DOCUMENTS

| | | | |
|---|---|---|---|
| 5,614,855 A | 3/1997 | Lee et al. | |
| 6,853,225 B2 | 2/2005 | Lee | |
| 6,859,081 B2 | 2/2005 | Hong et al. | |
| 6,963,235 B2 | 11/2005 | Lee | |
| 2004/0066873 A1 | 4/2004 | Cho et al. | |
| 2004/0155686 A1* | 8/2004 | Kim et al. | 327/158 |
| 2006/0001462 A1* | 1/2006 | Kim et al. | 327/144 |
| 2006/0197565 A1 | 9/2006 | Kang | |

FOREIGN PATENT DOCUMENTS

| | | |
|---|---|---|
| JP | 2004-129255 | 4/2004 |
| KR | 1020000055361 | 9/2000 |
| KR | 1020010110968 | 12/2001 |
| KR | 1020050055925 | 6/2005 |

OTHER PUBLICATIONS

"A Register-Controlled Digital DLL with Digital Duty Cycle Detector for Multi Gbps GDDR3 SDRAM", Memory R&D Division, Hynix Semiconductor Inc. Ichon, Kyoungki, Korea, hyunwoo.lee@hynix.com.

* cited by examiner

*Primary Examiner*—Lincoln Donovan
*Assistant Examiner*—Ryan C Jager
(74) *Attorney, Agent, or Firm*—Venable LLP; Jeffri A. Kaminski

(57) ABSTRACT

A DLL circuit includes a duty ratio detection unit that detects a duty ratio of a rising clock and a duty ratio of a falling clock, thereby outputting a duty ratio detection signal. A correction control unit generates a correction control signal in response to the duty ratio detection signal. A duty ratio correction unit corrects a duty ratio of an internal. clock in response to the correction control signal, thereby outputting a reference clock.

64 Claims, 3 Drawing Sheets

DLL CIRCUIT AND METHOD OF CONTROLLING THE SAME

CROSS-REFERENCE TO RELATED PATENT APPLICATION

This application claims the benefit of Korean Patent Application No. 10-2007-0007371, filed on Jan. 24, 2007, in the Korean Intellectual Property Office, the disclosure of which is incorporated herein in its entirety by reference.

BACKGROUND OF THE INVENTION

1. Technical Field

The present invention relates to a DLL (Delay Locked Loop) circuit and a method of controlling the same, and in particular, to a DLL circuit that may accurately output a clock having an improved duty ratio quality and a method of controlling the same.

2. Related Art

Generally, a DLL circuit is used to supply an internal clock having an earlier phase than a reference clock, which is obtained by converting an external clock, for a predetermined time. The internal clock is generated to allow a semiconductor memory apparatus having a relatively high integration density, such as a synchronous DRAM (SDRAM) or the like, to operate in synchronization with the external clock.

More specifically, a clock input buffer receives an external clock and outputs an internal clock. At this time, the internal clock has a phase delayed from the external clock for a predetermined time by the clock input buffer. The phase of the internal clock is additionally delayed by delay elements in the semiconductor integrated circuit, and then transmitted to a data output buffer. Subsequently, the internal clock controls the data output buffer to output data.

Accordingly, output data is delayed as compared with the external clock for a considerable amount of time. A phase of the external clock is staggered with the output data.

To solve this problem, a DLL circuit is used. The DLL circuit adjusts the phase of the internal clock to be earlier than the external clock for a predetermined time. Accordingly, output data is not delayed as compared with the external clock. That is, the DLL circuit receives the external clock and generates the internal clock having an earlier phase than the external clock for a predetermined time.

In a semiconductor memory apparatus, such as a DDR (Double Data Rate) SDRAM, a dual loop type DLL circuit is used to generate a rising clock and a falling clock. The DLL circuit includes a phase mixer that adjusts the duty ratio of a clock output from a delay line to 50%. The DLL circuit includes feedback lines each having a delay line, a delay modeling unit, and a phase comparator. Each of the delay lines performs a coarse delay operation and a fine delay operation under the control of an operation mode setting unit.

In the DLL circuit according to the related art, which includes a dual loop and controls the duty ratio of the clock using the phase mixer, a clock having a predetermined duty ratio is not accurately generated. The phase mixer has a plurality of drivers that is provided at its pull-up section, a plurality of drivers that is provided at its pull-down section, and a driving section that is provided to drive a voltage formed at a node between the pull-up section and the pull-down section. The plurality of drivers provided in the phase mixer has driving ability that may change according to a change in PVT (Process, Voltage, and Temperature). When a difference in driving ability between the drivers at the pull-up section and the pull-down section occurs due to the change in PVT, if the level of the voltage formed at the node between the pull-up section and the pull-down section is changed, the voltage on the node may be dominantly influenced by the driving ability of one of the pull-up section or the pull-down section. Accordingly, a clock having a predetermined duty ratio is not accurately generated. Further, when a low-frequency clock signal is input to the DLL circuit, a more accurate duty ratio correction operation is needed, but the DLL circuit does not perform such a duty ratio correction operation.

However, the DLL circuit according to the related art includes two feedback loops, each having a circuit for controlling the phase mixer. Thus, an area where the components are disposed is not so small. Further, in the case where the low-frequency clock signal is input to the DLL circuit, the phase mixer needs to have a considerable number of elements. Therefore, in view of the area where the components are disposed, the DLL circuit according to the related art has problems, and accordingly power consumption of the individual components becomes high. As a result, low-power consumption and high integration density of the semiconductor integrated circuit are not easily realized.

SUMMARY OF THE INVENTION

Embodiments of the present invention provide a DLL circuit that outputs a clock having an improved duty ratio quality and a method of controlling the same.

An embodiment of the present invention provides a DLL circuit including: a duty ratio detection unit configured to detect a duty ratio of a rising clock and a duty ratio of a falling clock, thereby outputting a duty ratio detection signal; a correction control unit configured to receive the duty ratio detection signal and generate a correction control signal in response to the duty ratio detection signal; and a duty ratio correction unit configured to receive the correction control signal, correct a duty ratio of an internal clock in response to the correction control signal, thereby outputting a reference clock.

Another embodiment of the present invention provides a DLL circuit including: a duty ratio correction unit configured to correct a duty ratio of an internal clock according to a duty ratio of a rising clock and a duty ratio of a falling clock, thereby outputting a reference clock; and a phase mixing unit configured to receive the rising clock and the falling clock and selectively mix a phase of the rising clock and a phase of the falling clock according to whether or not an operation of the duty ratio correction unit is limited.

Still another embodiment of the present invention provides a method of controlling a DLL circuit including: detecting a duty ratio of a rising clock and a duty ratio of a falling clock; outputting a duty ratio detection signal based on the detecting the duty ratio; generating a correction control signal in response to the duty ratio detection signal; correcting a duty ratio of an internal clock in response to the correction control signal; and outputting a reference clock based on the correcting the duty ratio.

Yet another embodiment of the present invention provides a method of controlling a DLL circuit including: correcting a duty ratio of an internal clock according to a duty ratio of a rising clock and a duty ratio of a falling clock; outputting a reference clock based on the correcting the duty ratio; and selectively mixing the rising clock and the falling clock according to whether or not an operation to correct the duty ratio of the internal clock is limited.

DESCRIPTION OF EXEMPLARY EMBODIMENT

Hereinafter, an exemplary embodiment will be described in detail with reference to the accompanying drawings.

Figure 1:
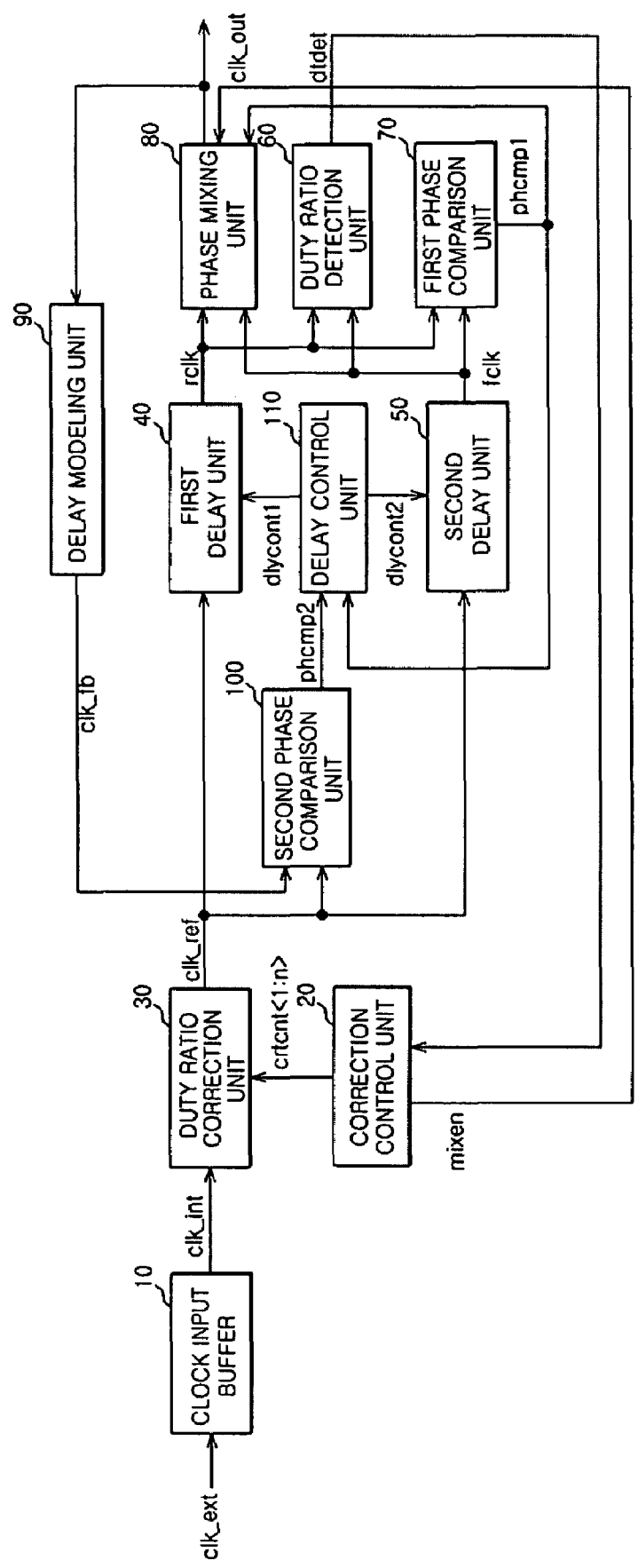
FIG. 1 is an exemplary block diagram showing a configuration of a DLL circuit according to one embodiment.

Referring to FIG. 1, a DLL circuit include a clock input buffer 10, a correction control unit 20, a duty ratio correction unit 30, a first delay unit 40, a second delay unit 50, a duty ratio detection unit 60, a first phase comparison unit 70, a phase mixing unit 80, a delay modeling unit 90, a second phase comparison unit 100, and a delay control unit 110.

The clock input buffer 10 buffers an external clock clk_ext, thereby generating an internal clock clk_int.

The correction control unit 20 generates an n-bit (where n is a natural number of 2 or more) correction control signal crtcnt<1:n> and a mixing enable signal mixen in response to a duty ratio detection signal dtdet.

The duty ratio correction unit 30 corrects the duty ratio of the internal clock clk_int in response to the n-bit correction control signal crtcnt<1:n>, thereby outputting a reference clock clk_ref.

The first delay unit 40 delays the reference clock clk_ref in response to a first delay control signal dlycont1, thereby outputting a rising clock rclk.

The second delay unit 50 delays the reference clock clk_ref in response to a second delay control signal dlycont2, thereby outputting a falling clock fclk.

The duty ratio detection unit 60 detects a duty ratio of the rising clock rclk and a duty ratio of the falling clock fclk, thereby outputting the duty ratio detection signal dtdet.

The first phase comparison unit 70 compares a phase of the rising clock rclk with a phase of the falling clock fclk, thereby generating a first phase comparison signal phcmp1.

The phase mixing unit 80 mixes the phase of the rising clock rclk and the phase of the falling clock fclk in response to the mixing enable signal mixen and the first phase comparison signal phcmp1, thereby generating an output clock clk_out.

The delay modeling unit 90 performs modeling of delay time of delay elements in a transmission path, through which the output clock clk_out is transmitted to a data output buffer, and delay the output clock clk_out to generate a feedback clock clk_fb.

The second phase comparison unit 100 compares the phase of the reference clock clk_ref with the phase of the feedback clock clk_fb, thereby generating a second phase comparison signal phcmp2.

The delay control unit 110 generates the first delay control signal dlycont1 and the second delay control signal dlycont2 in response to the first phase comparison signal phcmp1 and the second phase comparison signal phcmp2.

At a time of an initial operation of the DLL circuit, the rising clock rclk output from the first delay unit 40 and the falling clock fclk output from the second delay unit 50 have opposite phases with respect to each other. The first phase comparison unit 70 generates the first phase comparison signal phcmp1 to align the rising edge of the rising clock rclk with the rising edge of the falling clock fclk. Subsequently, when the rising edge of the rising clock rclk is aligned with the rising edge of the falling clock fclk, the duty ratio detection unit 60 inverts the two clocks and compares the rising edges of the two inverted clocks. Accordingly, the duty ratio detection unit 60 determines the duty ratio of the rising clock rclk and the duty ratio of the falling clock fclk, for example whether the duty ratio is more than, accurately equal to, or less than 50%. The duty ratio detection signal dtdet may be implemented by a multi-bit signal, for example, 3-bit signal, and includes information regarding the duty ratio of the rising clock rclk and the duty ratio of the falling clock fclk.

The correction control unit 20 generates the n-bit correction control signal crtcnt<1:n> according to the information included in the duty ratio detection signal dtdet. If the logical value of the n-bit correction control signal crtcnt<1:n> reaches a limit value, the correction control unit 20 enables the mixing enable signal mixen. The fact that the logical value of the n-bit correction control signal crtcnt<1:n> is the minimum or maximum means that ability of the duty ration correction unit 30 to correct the duty ratio of the internal clock clk_int is limited. If the mixing enable signal mixen is enabled, the phase mixing unit 80 additionally corrects the duty ratio of the rising clock rclk and the duty ratio of the falling clock fclk. The duty ratio correction unit 30 also has ability to completely correct a low-frequency clock, in which case an area where the duty ratio correction unit 30 is disposed may be considerably increased. Meanwhile, when the correction control unit 20 and the phase mixing unit 80 perform the above-described function, the area is not increased as much.

The duty ratio correction unit 30 corrects the duty ratio of the internal clock clk_int in response to the n-bit correction control signal crtcnt<1:n>, thereby outputting the reference clock clk_ref. Subsequently, the reference clock clk_ref is input to the first delay unit 40 and the second delay unit 50, and delayed according to the first delay control signal dlycont1 and the second delay control signal dlycont2. Then, the first delay unit 40 and the second delay unit 50 output the rising clock rclk and the falling clock fclk, respectively.

If the mixing enable signal mixen is disabled, the phase mixing unit 80 drives the rising clock rclk to output the output clock clk_out. If the mixing enable signal mixen is enabled, the phase mixing unit 80 mixes the phase of the rising clock rclk and the phase of the falling clock fclk to generate the output clock clk_out. When the mixing enable signal mixen is enabled, the phase mixing unit 80 performs a phase mixing operation of the two clocks under the control of the first phase comparison signal phcmp1. A general phase mixer mixes the phases under the influence of the clock having an earlier phase of the two input clocks. The phase mixing unit 80 compensates for this influence by reinforcing the driving ability of the clock having a later phase according to an instruction of the first phase comparison signal plicmp1.

The delay modeling unit 90 performs modeling of delay time by delay elements in a transmission path, through which the output clock clk_out is transmitted to the data output buffer, and applies the delay time to the output clock clk_out to generate the feedback clock clk_fb. Subsequently, the second phase comparison unit 100 compares the phase of the reference clock clk_ref with the phase of the feedback clock clk_fb, thereby generating the second phase comparison signal phcmp2. The delay control unit 110 generates the first delay control signal dlycont1 and the second delay control signal dlycont2 in response to the first phase comparison signal phcmp1 and the second phase comparison signal phcmp2, and transmit the first delay control signal dlycont1 and the second delay control signal dlycont2 to the first delay unit 40 and the second delay unit 50, respectively.

As described above, in the DLL circuit according to this embodiment, the duty ratio correction unit 30 is disposed in front of the first delay unit 40 and the second delay unit 50. Accordingly, since the reference clock clk_ref having a corrected duty ratio is input to the first delay unit 40 and the second delay unit 50, the output clock clk_out having a duty ratio of, for example, 50% may be accurately generated. Further, when the duty ratio correction unit 30 has insufficient correction ability, for example, when a low-frequency clock is input, the phase mixing unit 80 performs selectively a duty ratio correcting operation. In this case, the phase mixing unit 80 adjusts the driving ability of the rising clock rclk and the driving ability of the falling clock fclk according to the phase of the rising clock rclk and the phase of the falling clock fclk. Therefore, the output clock clk_out having a duty ratio of, for example, 50% may be more accurately generated, without increasing the area where the components are disposed.

Figure 2:
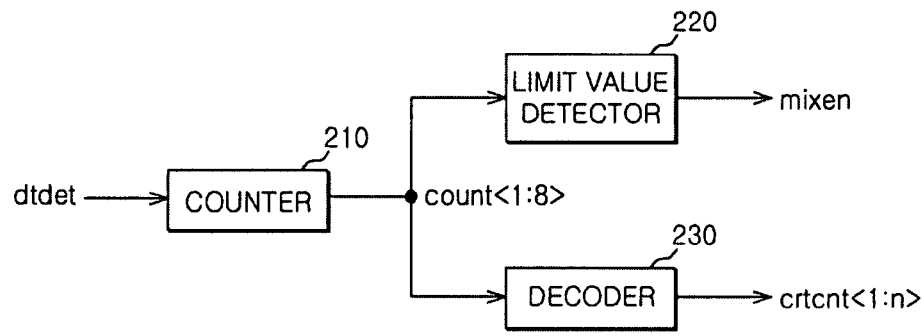
FIG. 2 is an exemplary diagram showing a configuration of a correction control unit shown in FIG. 1.

Referring to FIG. 2, the correction control unit 20 includes a counter 210 that performs an addition or subtraction operation in response to the duty ratio detection signal dtdet to generate an m-bit count signal count<1:m>.

The m-bit count signal count<1:m> may be used as, for example, the n-bit correction control signal crtcnt<1:n>, for example, in this case, m=n. The counter 210 adjusts the logical value of the m-bit count signal count<1:m> according to duty ratio information of the rising clock rclk and the falling clock fclk in the duty ratio detection signal dtdet. For example, if the duty ratio of the rising clock rclk is more than 50%, and the duty ratio of the falling clock fclk is less than 50%, the logical value of the count signal count<1:m> is decreased. As a further example, if the duty ratio of the rising clock rclk is less than 50%, and the duty ratio of the falling clock fclk is more than 50%, the logical value of the count signal count<1:m> is increased. As an additional example, if the duty ratio of the rising clock rclk and the duty ratio of the falling clock fclk are equal to 50%, the logical value of the count signal count<1:m> is fixed.

The correction control unit 20 may further include a limit value detector 220 that determines whether or not the logical value of the m-bit count signal count<1:m> is the maximum or minimum, thereby generating the mixing enable signal mixen, and a decoder 230 that may decode the m-bit count signal count<1:m>, thereby outputting the n-bit correction control signal crtcnt<1:n>.

In this case, the limit value detector 220 enables the mixing enable signal mixen when the logical value of the count signal count<1:m> is the maximum or minimum. Otherwise the limit value detector 220 disables the mixing enable signal mixen. Then, the decoder 230 decodes the count signal count<1:m> to generate the n-bit correction control signal crtcnt<1:n> and transmit the generated n-bit correction control signal crtcnt<1:n> to the duty ratio correction unit 30. The n-bit correction control signal crtcnt<1:n> may be implemented in a form having, for example, a single high-level signal. If the logical value of the count signal count<1:m> increases, the high-level signal in the n-bit correction control signal crtcnt<1:n> may be shifted to an upper-level bit.

Figure 3:
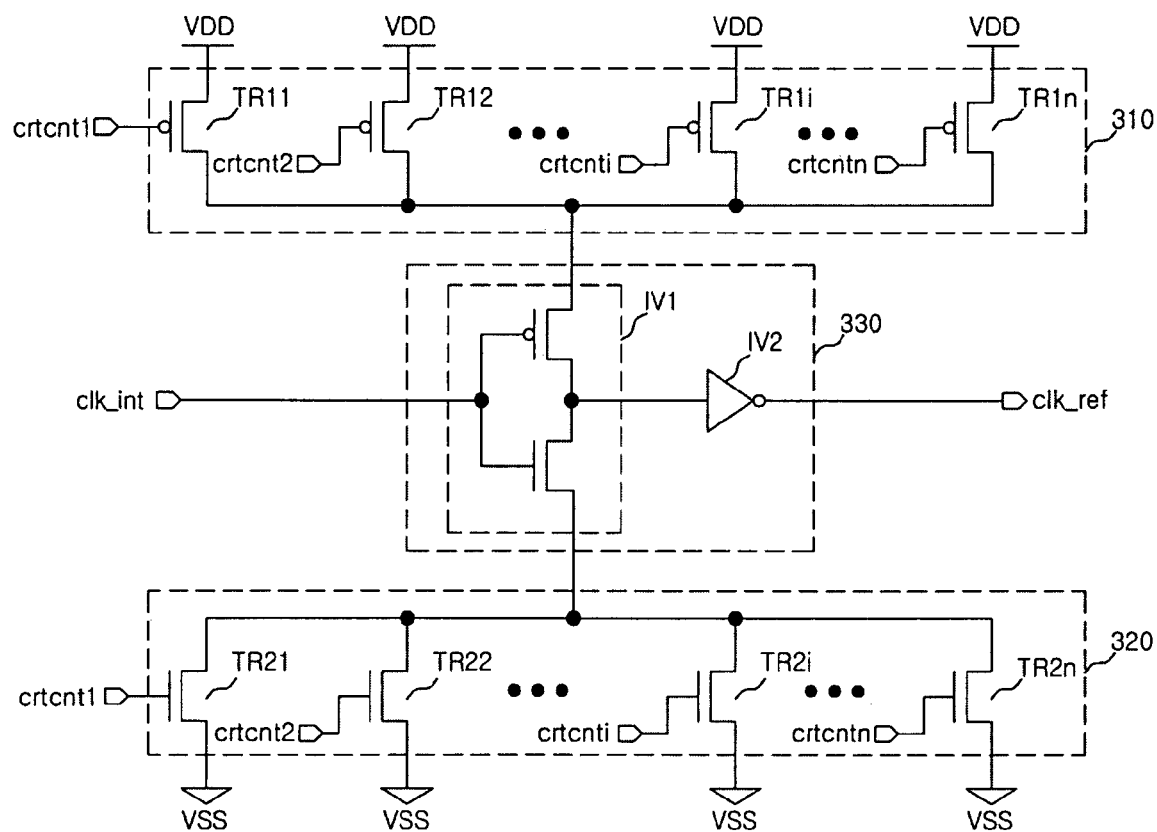
FIG. 3 is an exemplary diagram showing a configuration of a duty ratio correction unit shown in FIG. 1.

Referring to FIG. 3, the duty ratio correction unit 30 includes a pull-up unit 310, a pull-down unit 320, and a driving unit 330.

The pull-up unit 310 pulls up the driving unit 330 in response to the n-bit correction control signal crtcnt<1:n>.

The pull-down unit 320 pulls down the driving unit 330 in response to the n-bit correction control signal crtcnt<1:n>.

The driving unit 330 drives the internal clock clk_int in response to the pull-up operation of the pull-up unit 310 and the pull-down operation of the pull-down unit 320, and thereby outputting the reference clock clk_ref.

The pull-up unit 310 includes n first transistors TR1<1:n>, each of which has a gate terminal receiving a signal in the n-bit correction control signal crtcnt<1:n>, and which are arranged in parallel between a supply terminal of an external power supply voltage VDD and the driving unit 330.

The pull-down unit 320 includes n second transistors TR2<1:n>, each of which has a gate terminal receiving a signal in the n-bit correction control signal crtcnt<1:n>, and which are arranged in parallel between a supply terminal of a ground power supply voltage VSS and the driving unit 330.

The driving unit 330 includes a first inverter IV1 that is applied with voltages to be supplied from the pull-up unit 310 and the pull-down unit 320, and receives the internal clock clk_int, and a second inverter IV2 that receives an output signal of the first inverter IV1 and output the reference clock clk_ref.

In the case that the n-bit correction control signal crtcnt<1:n> is the m-bit count signal count<1:m>, if a number of low-level signals of the n-bit correction control signal crtcnt<1:n> increase, the amount of voltage to be supplied from the pull-up unit 310 to the first inverter IV1 of the driving unit 330 increases and accordingly, the high-level period of the output signal of the first inverter IV1 is extended. Subsequently, the reference clock clk_ref output from the second inverter IV2 has an extended low-level period.

If a number of high-level signals of the n-bit correction control signal crtcnt<1:n> increase, the amount of voltage to be supplied from the pull-down unit 320 to the first inverter IV1 of the driving unit 330 increases and accordingly, the low-level period of the output signal of the first inverter IV1 is extended. Then, the reference clock clk_ref to be output from the second inverter IV2 has an extended high-level period.

In the case that the n-bit correction control signal crtcnt<1:n> is output from the decoder 230, the n first transistors TR1<1:n> are different in size. Similarly, the n second transistors TR2<1:n> are also different in size with respect to each another. In the semiconductor integrated circuit, a transistor has a different resistance according to the size with respect to other transistors. Accordingly, for example, if the signal in the n-bit correction control signal crtcnt<1:n> is shifted by one bit, each of the resistance values of the pull-up unit 310 and the pull-down unit 320 is changed, and thus the driving ability of the pull-up unit 310 and driving ability of the pull-down unit 320 is also changed.

Figure 4:
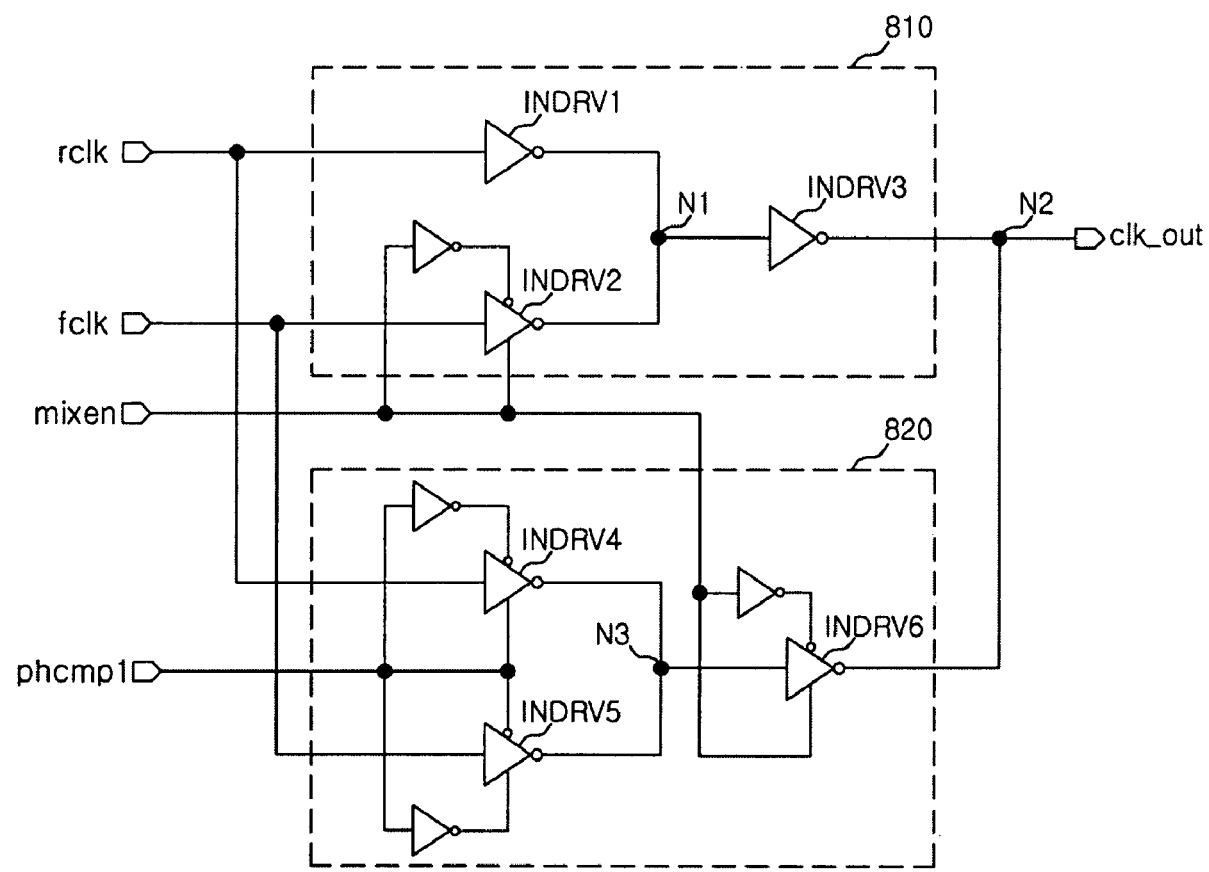
FIG. 4 is an exemplary diagram showing a configuration of a phase mixing unit shown in FIG. 1.

Referring to FIG. 4, the phase mixing unit 80 includes a phase mixer 810 that selectively mixes the phase of the rising clock rclk and the phase of the falling clock fclk according to whether or not the mixing enable signal mixen is enabled, and a driving ability compensator 820 that drives the rising clock rclk or the falling clock fclk in response to the mixing enable signal mixen and the first phase comparison signal phcmp1.

The phase mixer 810 includes a first invert driver INDRV1 that inverts and drives the rising clock rclk and output the inverted rising clock rclk to a first node N1; a second invert driver INDRV2 that, if the mixing enable signal mixen is enabled, invert and drives the falling clock fclk and outputs the inverted falling clock fclk to the first node N1; and a third invert driver INDRV3 that inverts and drives a voltage of the first node N1 and outputs the inverted voltage to a second node N2 at which the output clock clk_out is formed.

The driving ability compensator 820 includes a fourth invert driver INDRV4 that inverts and drives the rising clock rclk in response to the first phase comparison signal phcmp1 and outputs the inverted rinsing clock rclk to a third node N3; a fifth invert driver INDRV5 that inverts and drives the falling clock fclk in response to the first phase comparison signal phcmp1 and outputs the inverted falling clock fclk to the third node N3; and a sixth invert driver INDRV6 that, if the mixing enable signal mixen is enabled, inverts and drives a voltage of the third node N3 and outputs the inverted voltage to the second node N2.

If the mixing enable signal mixen is disabled, the second invert driver INDRV2 of the phase mixer 810 and the sixth invert driver INDRV6 of the driving ability compensator 820 are disabled. Accordingly, the output clock clk_out is generated in such a form that the rising clock rclk is driven by the first invert driver INDRV1 and the second invert driver INDRV2.

If the mixing enable signal mixen is enabled, the second invert driver INDRV2 and the sixth invert driver INDRV6 are enabled. The fourth invert driver INDRV4 of the driving ability compensator 820 is enabled if the first phase comparison signal phcmp1 is at a first level, in this example, a high level, and the fifth invert driver INDRV5 is enabled if the first phase comparison signal phcmp1 is at a second level, in this example, a low level. Accordingly, when the phase of the falling clock fclk precedes the phase of the rising clock rclk, the first phase comparison signal phcmp1 enables the fourth invert driver INDRV4. Further, when the phase of the rising clock rclk precedes the phase of the falling clock fclk, the first phase comparison signal phcmp1 enables the fifth invert driver INDRV5.

The phase mixing unit 80 performs an operation to selectively mix the rising clock rclk and the falling clock fclk according to whether or not the mixing enable signal mixen is enabled. Further, the phase mixing unit 80 compensates the driving ability of a clock having a later phase of the rising clock rclk and the falling clock fclk in response to the first phase comparison signal phcmp1. As a result, the output clock clk_out is prevented from being influenced by a clock having an earlier phase of the rising clock rclk and the falling clock fclk.

As described above, the DLL circuit according to the embodiment detects the duty ratio of the rising clock and the duty ratio of the falling clock output from the first delay unit and the second delay unit, respectively, correct the duty ratio of the reference clock on the basis of the detected duty ratios of the rising clock and the falling clock, and supply the reference clock having a corrected duty ratio to the first delay unit and the second delay unit. Accordingly, the DLL circuit according to the embodiment of the present invention performs an accurate duty ratio correction operation. In addition, the DLL circuit according to the embodiment continuously monitors a change in delay amount of an individual delay element due to a change in PVT, thereby more accurately generating the output clock having a duty ratio of, for example, 50%.

The DLL circuit according to an embodiment selectively operates the phase mixing unit only when the operation ability of the duty ratio correction unit is limited, for example, when a low-frequency clock is input. This affects the area where the components are disposed and power consumption. Further, the DLL circuit according to one embodiment may prevent the duty ratio of the output clock from being distorted due to an erroneous operation of the phase mixing unit.

According to the embodiments, the DLL circuit and the method of controlling the same outputs a clock having an improved duty ratio quality.

Further, according to the embodiments, the DLL circuit and the method of controlling the same outputs a clock having a duty ratio which does not change due to a change in PVT.

In addition, according to the embodiments, the DLL circuit and the method of controlling the same increases an area margin, and reduce power consumption, which results in low power consumption and high integration of a semiconductor integrated circuit.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A DLL (Delay Locked Loop) circuit comprising:
   a duty ratio detection unit configured to detect a duty ratio of a rising clock and a duty ratio of a falling clock and output a duty ratio detection signal;
   a correction control unit configured to receive the duty ratio detection signal and generate a correction control signal in response to the duty ratio detection signal and, if a logical value of the correction control signal reaches a limit value, to enable a mixing enable signal; and
   a duty ratio correction unit configured to receive the correction control signal, correct a duty ratio of an internal clock in response to the correction control signal, and output a reference clock.

2. The DLL circuit of claim 1,
   wherein, after a first edge of the rising clock is aligned with a first edge of the falling clock, the duty ratio detection unit is configured to receive and compare a second edge of the rising clock with a second edge of the falling clock, determine the duty ratio of the rising clock and the duty ratio of the falling clock, and generate the duty ratio detection signal.

3. The DLL circuit of claim 1,
   wherein the correction control unit comprises a counter configured receive the duty ratio detection signal and perform an addition or subtraction operation in response to the duty ratio detection signal in order to generate a multi-bit count signal, and output the multi-bit count signal as the correction control signal.

4. The DLL circuit of claim 3,
   wherein the duty ratio correction unit is configured to receive the multi-bit signal of the correction control signal, correct the duty ratio of the internal clock according to a number of high-level signals and a number of low-level signals in the multi-bit count signal of the correction control signal, and output the reference clock.

5. The DLL circuit of claim 4,
   wherein the duty ratio correction unit comprises:
   a pull-up unit configured to receive the correction control signal and pull up a driving unit in response to the correction control signal;
   a pull-down unit configured to receive the correction control signal and pull down the driving unit in response to the correction control signal; and the driving unit configured to drive the internal clock according to the pull-up operation of the pull-up unit and the pull-down operation of the pull-down unit, and output the reference clock.

6. The DLL circuit of claim 5,
wherein the pull-up unit comprises a plurality of transistors having different sizes; and
wherein the pull-down unit comprises a plurality of transistors having different sizes.

7. The DLL circuit of claim 1,
wherein the correction control unit comprises:
a counter configured receive the duty ratio detection signal, perform an addition or subtraction operation in response to the duty ratio detection signal, and generate a multi-bit count signal;
a limit value detector configured to determine whether or not the multi-bit count signal reaches a threshold value, and generate the mixing enable signal; and
a decoder configured to receive and decode the multi-bit count signal, and output the multi-bit correction control signal.

8. The DLL circuit of claim 7,
wherein the duty ratio correction unit is configured receive the multi-bit correction control signal, determine which bit of the multi-bit correction control signal includes a high-level signal, correct the duty ratio of the internal clock according to which bit of the multi-bit correction control signal includes the high-level signal, and output the reference clock.

9. The DLL circuit of claim 8,
wherein the duty ratio correction unit comprises:
a pull-up unit configured receive the correction control signal and pull up a driving unit in response to the correction control signal;
a pull-down unit configured receive the correction control signal and pull down the driving unit in response to the correction control signal; and
the driving unit configured to drive the internal clock in response to the pull-up operation of the pull-up unit and the pull-down operation of the pull-down unit, and output the reference clock.

10. The DLL circuit of claim 9,
wherein the pull-up unit comprises a plurality of transistors having different sizes; and
wherein the pull-down unit comprises a plurality of transistors having different sizes.

11. The DLL circuit of claim 1, further comprising:
a phase mixing unit configured to receive the rising clock, the falling clock, and the mixing enable signal and mix a phase of the rising clock and a phase of the falling clock in response to the mixing enable signal to generate an output clock.

12. The DLL circuit of claim 11,
wherein the phase mixing unit is configured to receive a first phase comparison signal, the rising clock and the falling clock and control the operation to mix the phase of the rising clock and the phase of the falling clock in response to a first phase comparison signal.

13. The DLL circuit of claim 12,
wherein the phase mixing unit comprises:
a phase mixer configured receive the rising clock, the falling clock, and the mixing enable signal and selectively mix the phase of the rising clock and the phase of the falling clock according to whether or not the mixing enable signal is enabled; and
a driving ability compensator configured to receive the rising clock or the falling clock, the mixing enable signal and the first phase comparison signal and drive the rising clock or the falling clock in response to the mixing enable signal and the first phase comparison signal.

14. The DLL circuit of claim 13,
wherein the phase mixer comprises:
a first node;
a second node configured to form the output clock;
a first invert driver configured to receive, invert and to drive the rising clock and output the inverted rising clock to the first node;
a second invert driver configured to receive the falling clock and the mixing signal and, if the mixing enable signal is enabled, invert and drive the falling clock and output the inverted falling clock to the first node; and
a third invert driver configured receive, invert and to drive a voltage of the first node to obtain an inverted voltage and output the inverted voltage to the second node.

15. The DLL circuit of claim 14,
wherein the driving ability compensator comprises:
a third node;
a fourth invert driver configured to receive, invert and drive the rising clock in response to the first phase comparison signal to obtain an inverted rising clock and output the inverted rising clock to the third node;
a fifth invert driver configured to receive, invert and drive the falling clock in response to the first phase comparison signal to obtain an inverted falling clock and output the inverted falling clock to the third node; an
a sixth invert driver configured to receive the mixing enable signal and a voltage of the third node and, if the mixing enable signal is enabled, invert and drive the voltage of the third node to obtain an second inverted voltage and output the second inverted voltage to the second node.

16. The DLL circuit of claim 12, further comprising:
a first phase comparison unit configured to receive the rising clock and the falling clock and compare the phase of the rising clock with the phase of the falling clock, thereby generating the first phase comparison signal.

17. The DLL circuit of claim 1, further comprising:
a clock input buffer configured to receive and buffer an external clock, thereby generating the internal clock.

18. The DLL circuit of claim 17, further comprising:
a first delay unit configured to receive the reference clock and a first delay control signal, delay the reference clock according to the control of the first delay control signal, and output the rising clock; and
a second delay unit configured receive the reference clock and a second delay control signal, delay the reference clock according to the control of the second delay control signal, and output the falling clock.

19. The DLL circuit of claim 18, further comprising:
a delay modeling unit configured receive the output clock, perform modeling of delay time by delay elements in a transmission path, apply the delay time to the output clock, and transmit the output clock to a data output buffer, to generate a feedback clock;
a second phase comparison unit configured receive the reference clock and the feedback clock, compare a phase of the reference clock with a phase of the feedback clock, and generate a second phase comparison signal; and
a delay control unit configured to receive the first phase comparison signal and the second phase comparison signal and generate the first delay control signal and the second delay control signal in response to the first phase comparison signal and the second phase comparison signal.

20. A DLL circuit comprising:
a duty ratio correction unit configured to receive a rising clock and a falling clock, correct a duty ratio of an internal clock according to a duty ratio of the rising clock and a duty ratio of a falling clock, and output a reference clock; and
a phase mixing unit configured receive the rising clock and the falling clock and selectively mix a phase of the rising clock and a phase of the falling clock according to whether or not an operation frequency of the duty ratio correction unit is limited.

21. The DLL circuit of claim 20, further comprising:
a duty ratio detection unit configured to receive the rising clock and the falling clock, detect the duty ratio of the rising clock and the duty ratio of the falling clock, and output a duty ratio detection signal; and
a correction control unit configured to receive the duty ratio detection signal and generate a multi-bit correction control signal and a mixing enable signal in response to the duty ratio detection signal.

22. The DLL circuit of claim 21,
wherein the duty ratio correction unit is configured to receive the multi-bit correction control signal and the internal clock, correct the duty ratio of the internal clock according to a number of high-level signals and a number of low-level signals in the multi-bit correction control signal, and output the reference clock.

23. The DLL circuit of claim 22,
wherein the duty ratio correction unit comprises:
a pull-up unit configured receive the multi-bit correction control signal and pull up a driving unit in response to the multi-bit correction control signal;
a pull-down unit configured receive the multi-bit correction control signal and pull down the driving unit in response to the multi-bit correction control signal; and
the driving unit configured to receive and drive the internal clock in response to the pull-up operation of the pull-up unit and the pull-down operation of the pull-down unit, and output the reference clock.

24. The DLL circuit of claim 23,
wherein the pull-up unit comprises a plurality of transistors having different sizes; and
wherein the pull-down unit comprises a plurality of transistors having different sizes.

25. The DLL circuit of claim 21,
wherein the duty ratio correction unit is configured receive the internal clock and the multi-bit correction control signal, correct the duty ratio of the internal clock according to which bit of the multi-bit correction control signal includes a high-level signal, and output the reference clock.

26. The DLL circuit of claim 25,
wherein the duty ratio correction unit comprises:
a pull-up unit configured to receive the multi-bit correction control signal and pull up a driving unit in response to the multi-bit correction control signal;
a pull-down unit configured to receive the multi-bit correction control signal and pull down the driving unit in response to the multi-bit correction control signal; and
the driving unit configured receive the internal clock, drive the internal clock in response to the pull-up operation of the pull-up unit and the pull-down operation of the pull-down unit, and output the reference clock.

27. The DLL circuit of claim 26,
wherein the pull-up unit comprises a plurality of transistors having different sizes; and
wherein the pull-down unit comprises a plurality of transistors having different sizes.

28. The DLL circuit of claim 21,
wherein the phase mixing unit is configured to receive the reference clock, the mixing enable signal, the rising clock, the falling clock and a first phase comparison signal, determine correction completion of the duty ratio of the reference clock according to whether or not the mixing enable signal is enabled, and control an operation to mix the phase of the rising clock and the phase of the falling clock in response to the first phase comparison signal to generate an output clock.

29. The DLL circuit of claim 28,
wherein the phase mixing unit comprises:
a phase mixer configured to receive the rising clock, the falling clock and mixing enable signal and selectively mix the phase of the rising clock and the phase of the falling clock according to whether or not the mixing enable signal is enabled; and
a driving ability compensator configured receive the rising clock or the falling clock, the first phase comparison signal and the mixing enable signal and drive the rising clock or the falling clock in response to the mixing enable signal and the first phase comparison signal.

30. The DLL circuit of claim 29,
wherein the phase mixer comprises:
a first node;
a second node configured to form the output clock;
a first invert driver configured to receive, invert and drive the rising clock to obtain an inverted rising clock and output the inverted rising clock to the first node;
a second invert driver configured to receive the mixing enable signal and the falling clock and, if the mixing enable signal is enabled, invert and drive the falling clock to obtain an inverted falling clock and output the inverted falling clock to the first node; and
a third invert driver configured to receive a voltage formed of the first node and invert and drive a voltage formed of the first node to obtain an inverted voltage and output the inverted voltage to the second node.

31. The DLL circuit of claim 30,
wherein the driving ability compensator comprises:
a third node;
a fourth invert driver configured receive the first phase comparison signal and the rising clock, invert and drive the rising clock in response to the first phase comparison signal to obtain an inverted rising clock and output the inverted rising clock to the third node;
a second invert driver configured to receive the first phase comparison signal and the falling clock, invert and drive the falling clock in response to the first phase comparison signal to obtain an inverted falling clock and to output the inverted falling clock to the third node; and
a third invert driver configured to receive the mixing enable signal and a voltage of the third node and, if the mixing enable signal is enabled, invert and drive the voltage of the third node to obtain an inverted voltage and output the inverted voltage to the second node.

32. The DLL circuit of claim 28, further comprising:
a first phase comparison unit configured to receive the rising clock and the falling clock, compare the phase of the rising clock with the phase of the falling clock, and generate the first phase comparison signal.

33. The DLL circuit of claim 21,
wherein, after a first edge of the rising clock is aligned with a first edge of the falling clock, the duty ratio detection unit is configured receive the rising clock and the falling clock, compare a second edge of the rising clock with a second edge of the falling clock, determine the duty ratio of the rising clock and the duty ratio of the falling clock, and generate the duty ratio detection signal.

34. The DLL circuit of claim 21,
wherein the correction control unit is configured to receive the duty ratio detection signal, generate the multi-bit correction control signal according to information included in the duty ratio detection signal and, if the multi-bit correction control signal reaches a limit value, enable the mixing enable signal.

35. The DLL circuit of claim 34,
wherein the correction control unit comprises:
a counter configured to receive the duty ratio detection signal, perform an addition or subtraction operation in response to the duty ratio detection signal, and generate a multi-bit count signal;
a limit value detector configured to determine whether or not the multi-bit count signal is the maximum or minimum, and generate the mixing enable signal; and
a decoder configured to receive and decode the multi-bit count signal, and output the multi-bit correction control signal.

36. The DLL circuit of claim 20, further comprising:
a clock input buffer configured receive and buffer an external clock, and generate the internal clock.

37. The DLL circuit of claim 20, further comprising:
a first delay unit configured receive the reference clock and a first delay control signal, delay the reference clock according to the control of the first delay control signal, and output the rising clock; and
a second delay unit configured to receive the reference clock and a second delay control signal, delay the reference clock according to the control of a second delay control signal, and output the falling clock.

38. The DLL circuit of claim 37, further comprising:
a delay modeling unit configured to perform modeling of delay time by delay elements in a transmission path, apply the delay time to the output clock ,and transmit the output clock to a data output buffer to generate a feedback clock;
a second phase comparison unit configured receive the reference clock and the feedback clock, compare the phase of the reference clock with the phase of the feedback clock, and generate a second phase comparison signal; and
a delay control unit configured to receive the first phase comparison signal and the second phase comparison signal and generate the first delay control signal and the second delay control signal in response to the first phase comparison signal and the second phase comparison signal.

39. A method of controlling a DLL circuit, the method comprising:
detecting a duty ratio of a rising clock and a duty ratio of a falling clock;
outputting a duty ratio detection signal based on the detecting the duty ratio;
generating a correction control signal in response to the duty ratio detection signal and, if a logical value of the correction control signal reaches a limit value, enabling a mixing enable signal;
correcting a duty ratio of an internal clock in response to the correction control signal; and
outputting a reference clock based on the correcting the duty ratio.

40. The method of claim 39,
wherein, after a first edge of the rising clock is aligned with a first edge of the falling clock, the outputting of the duty ratio detection signal comprises performing an operation to compare a second edge of the rising clock with a second edge of the falling clock, to determine the duty ratio of the rising clock and the duty ratio of the falling clock and generate the duty ratio detection signal.

41. The method of claim 39,
wherein the generating of the correction control signal comprises performing an addition or subtraction operation in response to the duty ratio detection signal to generate a multi-bit count signal, and outputting the multi-bit count signal as the correction control signal.

42. The method of claim 41,
wherein the outputting of the reference clock comprises correcting the duty ratio of the internal clock according to a number of high-level signals and a number of low-level signals in the correction control signal and outputting the reference clock.

43. The method of claim 39,
wherein the generating of the correction control signal comprises:
performing an addition or subtraction operation in response to the duty ratio detection signal to generate a multi-bit count signal;
generating the mixing enable signal according to whether or not the multi-bit count signal reaches the limit value;
decoding the multi-bit count signal; and
outputting the multi-bit correction control signal.

44. The method of claim 39,
wherein the outputting of the reference clock comprises correcting the duty ratio of the internal clock according to which bit of the multi-bit correction control signal includes a high-level signal, and outputting the reference clock.

45. The method of claim 39, further comprising, after the outputting of the reference clock:
mixing a phase of the rising clock and a phase of the falling clock in response to the mixing enable signal to generate an output clock.

46. The method of claim 45,
wherein the generating of the output clock comprises controlling the operation to mix the phase of the rising clock and the phase of the falling clock in response to a first phase comparison signal.

47. The method of claim 46, further comprising:
comparing the phase of the rising clock and the phase of the falling clock and generating the first phase comparison signal.

48. The method of claim 46,
wherein the generating of the output clock comprises:
selectively mixing the phase of the rising clock and the phase of the falling clock according to whether or not the mixing enable signal is enabled; and
driving the rising clock or the falling clock in response to the mixing enable signal and the first phase comparison signal.

49. The method of claim 48,
wherein the mixing of the rising clock and the falling clock comprises determining correction completion of the duty ratio of the reference clock according to whether or not the mixing enable signal is enabled, and controlling the operation to mix the phase of the rising clock and the phase of the falling clock in response to a first phase comparison signal to generate an output clock.

50. The method of claim 49,
wherein the mixing of the rising clock and the falling clock comprises:
selectively mixing the phase of the rising clock and the phase of the falling clock according to whether or not the mixing enable signal is enabled; and
driving the rising clock or the falling clock in response to the mixing enable signal and the first phase comparison signal.

51. The method of claim 49, further comprising:
comparing the phase of the rising clock with the phase of the falling clock and generating the first phase comparison signal.

52. The method of claim 39, further comprising:
buffering an external clock and generating the internal clock.

53. The method of claim 52, further comprising:
delaying the reference clock in response to a first delay control signal, thereby outputting the rising clock; and
delaying the reference clock in response to a second delay control signal, thereby outputting the falling clock.

54. The method of claim 53, further comprising:
performing modeling of delay time by delay elements in a transmission path, through which the output clock is transmitted to a data output buffer to delay the output clock and generate a feedback clock;
comparing the phase of the reference clock with the phase of the feedback clock to generate a second phase comparison signal; and
generating the first delay control signal and the second delay control signal in response to the first phase comparison signal and the second phase comparison signal.

55. A method of controlling a DLL circuit, the method comprising:
correcting a duty ratio of an internal clock according to a duty ratio of a rising clock and a duty ratio of a falling clock;
outputting a reference clock based on the correcting the duty ratio; and
selectively mixing the rising clock and the falling clock according to whether or not an operation frequency to correct the duty ratio of the internal clock is limited.

56. The method of claim 55, further comprising, before the outputting of the reference clock:
detecting the duty ratio of the rising clock and the duty ratio of the falling clock;
outputting a duty ratio detection signal based on the detecting the duty ratio; and
generating a multi-bit correction control signal and a mixing enable signal in response to the duty ratio detection signal.

57. The method of claim 56,
wherein the outputting of the reference clock comprises correcting the duty ratio of the internal clock according to a number of high-level signals and a number of low-level signals in the multi-bit correction control signal, thereby outputting the reference clock.

58. The method of claim 56,
wherein the outputting of the reference clock comprises correcting the duty ratio of the internal clock according to which bit of the multi-bit correction control signal includes a high-level signal, thereby outputting the reference clock.

59. The method of claim 58,
wherein, after a first edge of the rising clock is aligned with a first edge of the falling clock, the outputting of the duty ratio detection signal comprises performing an operation to compare a second edge of the rising clock with a second edge of the falling clock to determine the duty ratio of the rising clock and the duty ratio of the falling clock and generate the duty ratio detection signal.

60. The method of claim 56,
wherein the generating of the multi-bit correction control signal and the mixing enable signal comprises generating the multi-bit correction control signal according to information included in the duty ratio detection signal and, if the multi-bit correction control signal reaches a threshold value, enabling the mixing enable signal.

61. The method of claim 60,
wherein the generating of the multi-bit correction control signal and the mixing enable signal comprises:
performing an addition or subtraction operation in response to the duty ratio detection signal to generate a multi-bit count signal;
determining whether or not the multi-bit count signal is the maximum or minimum, to generate the mixing enable signal;
decoding the multi-bit count signal; and
outputting the multi-bit correction control signal.

62. The method of claim 55, further comprising: buffering an external clock to generate the internal clock.

63. The method of claim 62,
delaying the reference clock in response to a first delay control signal, thereby outputting the rising clock; and
delaying the reference clock in response to a second delay control signal, thereby outputting the falling clock.

64. The method of claim 63, further comprising:
performing modeling of delay time by delay elements in a transmission path, through which the output clock is transmitted to a data output buffer, to delay the output clock and generate a feedback clock;
comparing the phase of the reference clock with the phase of the feedback clock, to generate a second phase comparison signal; and
generating the first delay control signal and the second delay control signal in response to the first phase comparison signal and the second phase comparison signal.

* * * * *